United States Patent [19]
Lee

[11] Patent Number: 6,107,845
[45] Date of Patent: Aug. 22, 2000

[54] FREQUENCY CONTROL CIRCUIT FOR OSCILLATOR AND METHOD THEREFOR

[75] Inventor: Yun-Gi Lee, Daejeon, Rep. of Korea

[73] Assignee: LG Semicon Co., Ltd., Choongcheongbuk-do, Rep. of Korea

[21] Appl. No.: 09/186,351

[22] Filed: Nov. 5, 1998

[30] Foreign Application Priority Data

May 13, 1998 [KR] Rep. of Korea ............... 98-17230

[51] Int. Cl.[7] .................................................. H03B 19/00
[52] U.S. Cl. ........................ 327/113; 327/101; 327/105
[58] Field of Search .................................. 327/113, 101, 327/103, 114, 105; 332/117; 365/185.29, 185.24

[56] References Cited

U.S. PATENT DOCUMENTS

| | | | |
|---|---|---|---|
| 4,191,932 | 3/1980 | Nagahama | 331/111 |
| 5,208,557 | 5/1993 | Kersh, III | 331/57 |
| 5,233,566 | 8/1993 | Imamiya et al. | 365/230.08 |
| 5,594,391 | 1/1997 | Yoshizawa | 331/57 |
| 5,926,045 | 7/1999 | Kwon | 327/114 |
| 6,011,426 | 1/2000 | Seung-Ho | 327/536 |

*Primary Examiner*—Timothy P. Callahan
*Assistant Examiner*—Hai L. Nguyen

[57] ABSTRACT

A frequency control circuit for an oscillator and a method therefor are disclosed and which frequency control circuit includes a flash cell having a cell transistor, a switching unit for outputting a first voltage to the flash cell in the program mode in accordance with an enable signal and outputting a second voltage in the read mode, a write driver for outputting a program voltage to the flash cell in the program mode in accordance with the enable signal, a bias unit for supplying a current to the flash cell in the read mode in accordance with the enable signal and generating a frequency control voltage which is proportional to a threshold voltage of the flash cell, and an oscillator for varying the frequency in accordance with the thusly generated frequency control voltage.

26 Claims, 7 Drawing Sheets

FREQUENCY CONTROL CIRCUIT FOR OSCILLATOR AND METHOD THEREFOR

BACKGROUND OF THE INVENTION

1. Field of the Invention

The present invention relates to a voltage controlled oscillator(VCO), and more particularly to an frequency control circuit for an oscillator and a method therefor.

2. Description of the Background Art

Figure 1:
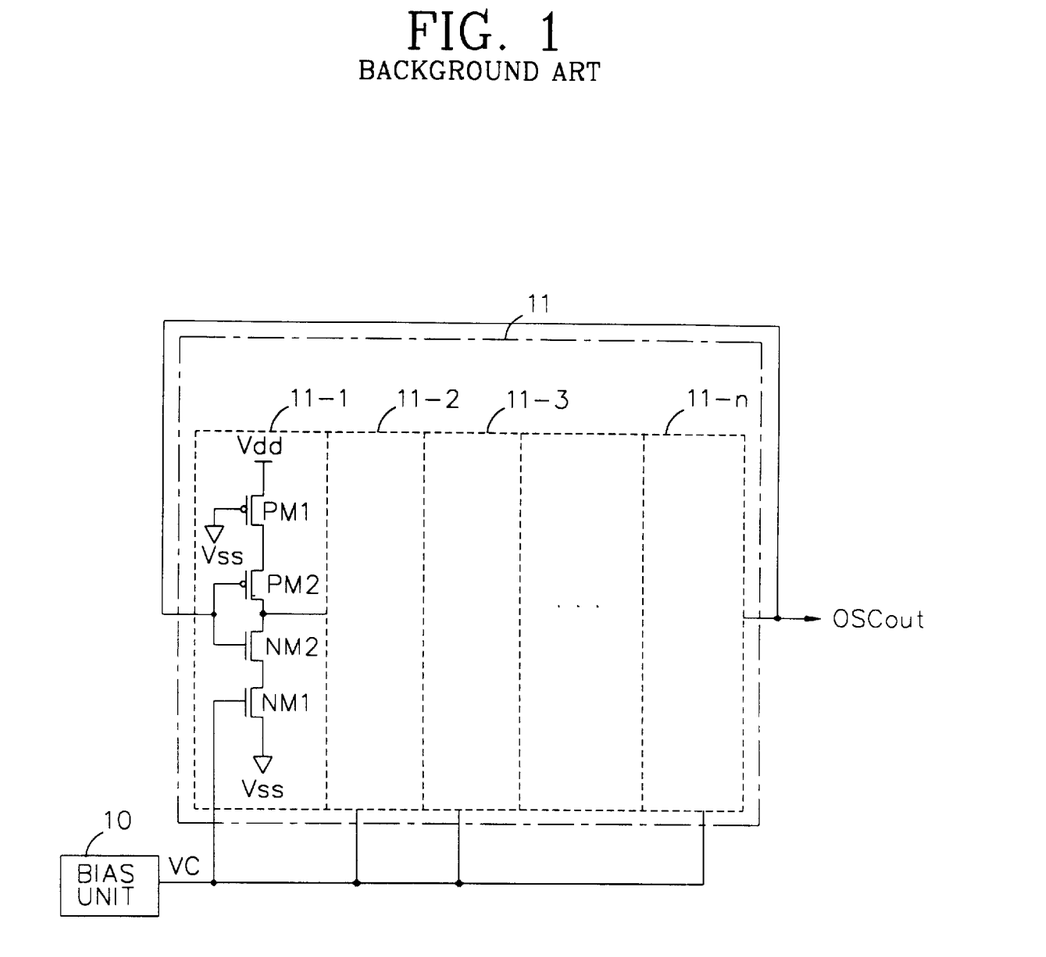
FIG. 1 is a circuit diagram illustrating a conventional oscillator circuit.

As shown in FIG. 1, a conventional oscillator circuit includes a bias unit 10 for generating a control voltage VC, and an oscillator 11 for controlling an oscillation frequency $f_{osc}$ of an output voltage $OSC_{out}$ according to the control voltage VC outputted from the bias unit 10.

The bias unit 10 includes transistors connected in an inverter type. The oscillator 11 is a ring oscillator having a plurality of delay units 11-1 to 11-n (n is an odd number) connected in a ring form. As is represented by the delay unit 11-1, each of the delay unit 11-1 to 11-n includes PMOS transistors PM1, PM2 and NMOS transistors NM2,NM1 which are connected in series between the power voltage Vdd and a ground. The PMOS transistor PM2 and the NMOS transistor NM2 constitute a complementary inverter, the gate of the PMOS transistor PM1 is connected to the ground and the gate of the NMOS transistor NM1 is applied with a control voltage VC.

The output node of the first delay unit 11-1 is connected to the input node of the second delay unit 11-2, the output node of the second delay unit 11-2 is connected to the input node of the third delay unit 11-3, and in the same manner, the outputs of the delay units 11-3 to 11 -(n–1) are respectively connected to the input nodes of the next delay units 11-4 to 11-n. The output node of the n-th delay unit 11-n is connected to the input node of the first delay unit 11-1, thereby forming a ring type connection.

The operation of the conventional oscillator circuit will now be described in detail with reference to the drawings.

When a control voltage VC is inputted from the bias circuit 10, the oscillator 11 controls the frequency $f_{osc}$ of the output voltage $OSC_{out}$ in accordance with the level of the control voltage VC. For example, assuming that the delay time of each of the delay units 11-1 to 11-n Td, the oscillation frequency $f_{osc}$ of the output voltage $OSC_{out}$ from the oscillator 11 is expressed by the following equation (1)

$$f_{osc}=1/(Td \times n) \quad (1)$$

where n represents the number of stages of the delay units.

The delay time Td depends on the time constant $T_{up}$ [$=C \times (rP1+rP2)$] determined by the turn-on resistances rP1, rP2 of the PMOS transistors PM1, PM2 and the parasitic capacitance C of the next stage gate capacitor or the like at the time of rise. Also, the delay time Td depends on the time constant $T_{down}$ [$=C \times (rN1+rN2)$] determined by the turn-on resistances rN1, rN2 of the NMOS transistors NM1, NM2 and the parasitic capacitance C at the time of fall. Therefore, the delay time Td may be expressed by the following equation (2).

$$Td \ (T_{up}+T_{down})/2 \quad (2)$$

Therefore, if the control voltage VC is varied, the turn-on resistance rN1 of the NMOS transistor NM1 is varied and the delay time Td is varied, thereby making it possible to vary the oscillation frequency $f_{osc}$.

Figure 2:
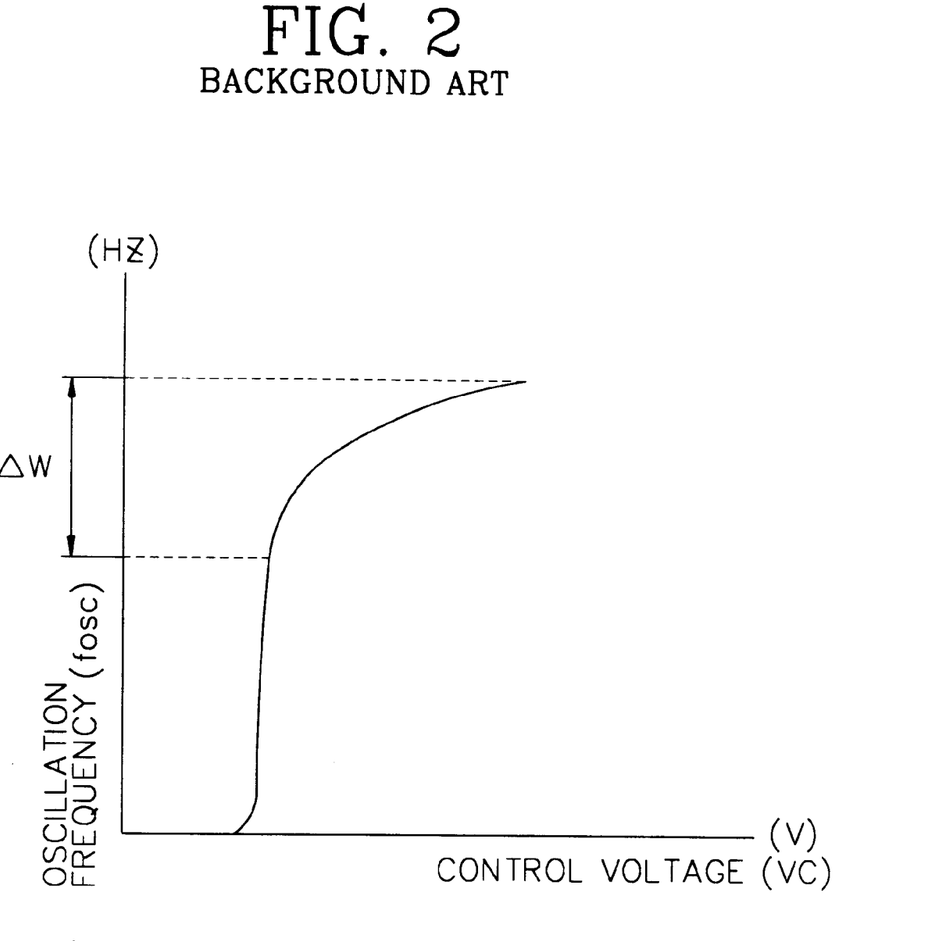
FIG. 2 is a graph illustrating the inclination of the control voltage-oscillation frequency characteristic curve in FIG. 1.

FIG. 2 illustrates the oscillation characteristic of the oscillator circuit of FIG. 1. The oscillation frequency $f_{osc}$ can be varied by the width of ΔW by changing the control voltage VC. At this time, the stability of the oscillation frequency $f_{osc}$ depends on the inclination of the control voltage VC- oscillation frequency $f_{osc}$ characteristic curve shown in FIG. 2 and the stable oscillation can be attained when the inclination is small. Thus, if the control voltage VC is increased, the oscillation frequency $f_{osc}$ is increased, and if the control voltage VC is decreased, the oscillation frequency $f_{osc}$ is decreased.

However, in the conventional oscillator, since the oscillation frequency $f_{osc}$ is controlled only by use of the NMOS transistor NM1, the oscillation is made unstable by the unbalance between the time constant $T_{up}$ and $T_{down}$ particularly when the the control voltage VC becomes low level and the NMOS transistor NM1 is turned off. Further, since the NMOS transistor NM1 is controlled by the control voltage VC, the variable range of the oscillation frequency $f_{osc}$ is determined by the control voltage VC.

Therefore, in the conventional oscillator circuit, in order to increase or decrease the control voltage VC, the size W/L of the transistor within the bias unit 10 is varied or a transistor is additionally used, thereby making it difficult to vary the oscillation frequency $f_{osc}$.

SUMMARY OF THE INVENTION

An object of the present invention is to provide a frequency control circuit and a method therefor which obviates problems of the conventional art.

Another object of the present invention is to provide a frequency control circuit and a method therefor which are capable of varying a oscillation frequency without changing the circuit.

Another object of the present invention is to provide a frequency control circuit and a method therefor which are capable of setting a oscillation frequency by varying a frequency control voltage in accordance with the program state of a flash cell.

To achieve the above objects, there is provided a frequency control circuit for an oscillator according to the present invention that includes a flash cell having a cell transistor, a switching unit for outputting a up voltage to the flash cell in the program mode in accordance with an enable signal and outputting a power supply voltage in the read mode, a write driver for outputting a program voltage to the flash cell in the program mode in accordance with the enable signal, a bias unit for supplying a current to the flash cell in the read mode in accordance with the enable signal and generating a frequency control voltage which is proportional to a threshold voltage of the flash cell, and an oscillator for varying the frequency in accordance with the thusly generated frequency control voltage.

To achieve the above objects, there is provided a frequency control method for an oscillator according to the present invention that includes the steps of measuring a frequency from an oscillator by performing a read operation of the flash cell, comparing the measured frequency with a reference frequency, varying the threshold voltage of the cell transistor by outputting first and second voltages to the gate and drain of the cell transistor when two frequencies are not identical, measuring the frequency from the oscillator in accordance with a frequency control voltage set in accordance with the varied threshold voltage by performing a read operation of the flash cell, and repeating the above-described steps until the measured frequency and reference frequency become identical.

Additional advantages, objects and features of the invention will become more apparent from the description which follows.

BRIEF DESCRIPTION OF THE DRAWINGS

The invention will be described in detail with reference to the following drawings in which like reference numerals refer to like elements wherein.

DETAILED DESCRIPTION OF THE PREFERRED EMBODIMENTS

Figure 3:
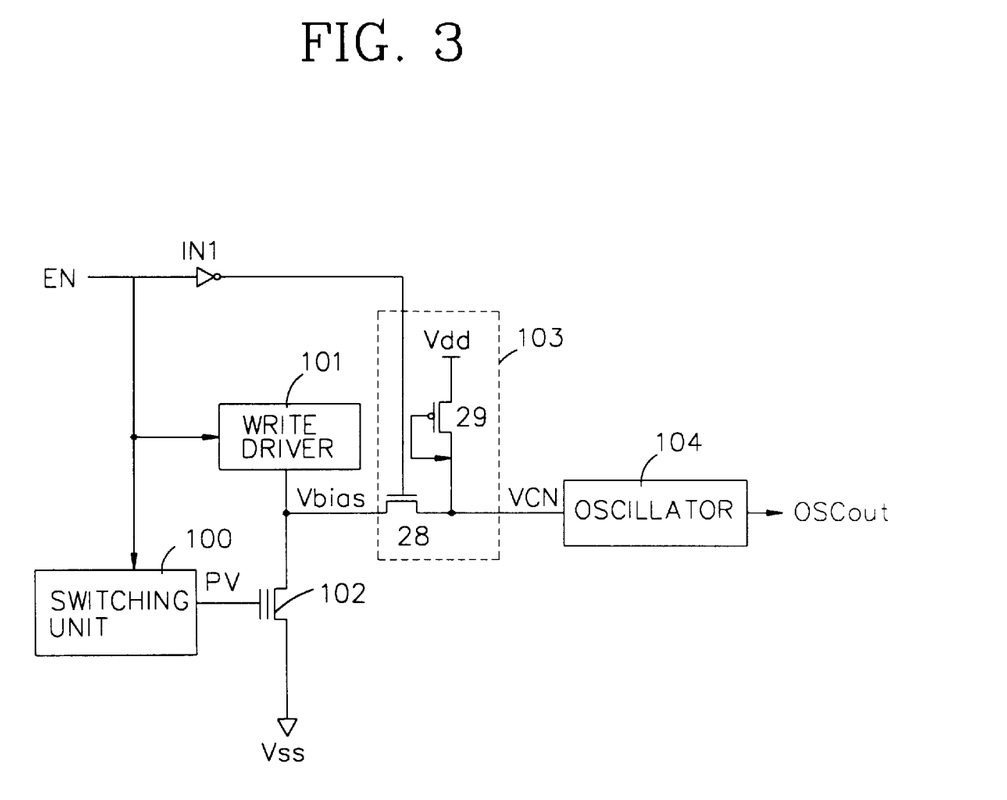
FIG. 3 is a block diagram illustrating a frequency control circuit for an oscillator according to the present invention.

FIG. 3 illustrates a block diagram of a frequency control circuit for an oscillator according to the present invention.

A switching unit 100 outputs a boosted voltage Vpp in the program mode (data write mode) according to an enable signal EN and outputs a power supply voltage Vdd in the read mode. Here, if the enable signal EN is a high level, the program mode of a flash cell 102 is set, and if the enable signal EN is a low level, the read mode is set. A write driver 101 outputs a program voltage $V_{WL}$ to the drain of the flash cell 102 in the program mode in accordance with the enable signal EN and is turned off in the read mode. The level of the program voltage $V_{WL}$ is greater than the power supply voltage Vdd.

The flash cell 102 includes a cell transistor and programs the program voltage $V_{WL}$ (data) from the write driver 101 by changing the threshold voltage Vt according to the boosted voltage Vpp outputted from the switching unit 100. The bias unit 103 supplies a current to the flash cell 101 for generating a frequency control voltage VCN in the read mode, and the oscillator 104 varies the oscillation frequency frequency $f_{osc}$ in proportional to the frequency control voltage VCN. Here, the frequency control voltage VCN is increased proportionally to the threshold voltage increase of the flash cell 102.

Figure 4:
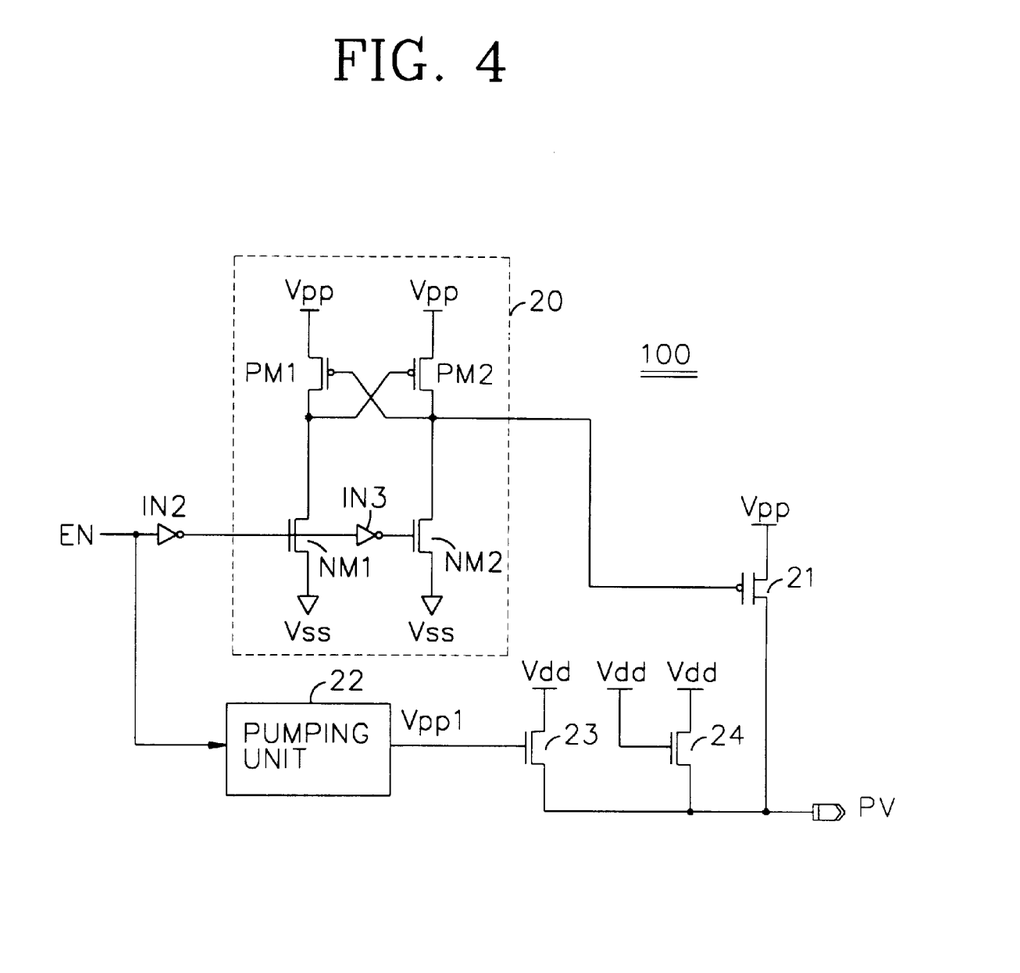
FIG. 4 is a detailed circuit illustrating a switching unit in FIG. 3.

As shown in FIG. 4, the switching unit 100 includes a level shifter 20 for outputting a ground voltage Vss in the program mode according to the inverted enable signal EN and a boosted voltage Vpp in the read mode, a PMOS transistor 21 for outputting a boosted voltage Vpp according to a ground voltage Vss from the level shifter in the program mode, a pumping unit 22 for outputting a pumping voltage Vpp1 in the read mode, a NMOS transistor 23 turned on by the pumping voltage Vpp1 for outputting the power supply voltage Vdd, and a NMOS transistor 24 for pulling-up the output terminal to the level of Vdd-Vt.

The level shifter 20 includes a PMOS transistor PM1 and NMOS transistor NM1 connected in series between the boosted voltage Vpp terminal and the ground, and a PMOS transistor PM2 and NMOS transistor NM2 connected in series between the boosted voltage Vpp terminal and the ground. The gates of the PMOS transistor PM1, PM2 are crossingly connected with the drains of the same, respectively. The gate of the NMOS transistor NM1 receives an output from the inverter IN2, and the gate of the NMOS transistor NM2 receives an output from the inverter IN3.

Figure 5:
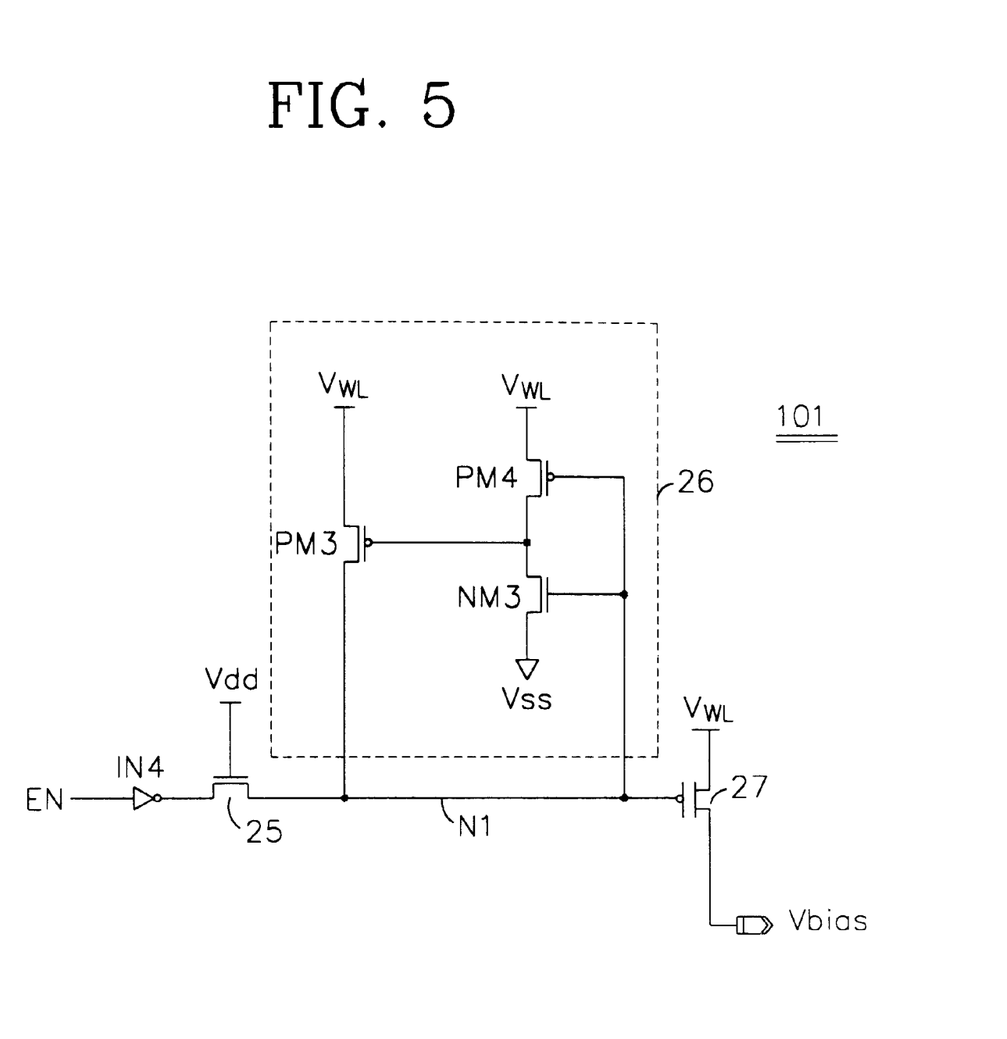
FIG. 5 is a detailed circuit illustrating a write driver in FIG. 3.

As shown in FIG. 5, the write driver 101 includes an inverter IN4 for inverting the enable signal EN, a transmission transistor 25 for transmitting an output of the inverter IN4, a latch unit 26 for maintaining the node N1 voltage as a ground voltage Vss in the program mode and maintaining the same as a program voltage $V_{WL}$ in the program mode, and a PMOS transistor 27 for outputting the program voltage $V_{WL}$ in the program mode in accordance with an output of the latch unit 26.

The latch unit 26 includes a PMOS transistor PM3 connected between the program voltage $V_{WL}$ and the node N1, and a PMOS transistor PM4 and NMOS transistor NM3 connected in series between the program voltage $V_{WL}$ and the ground. Each of the drain of the PMOS transistor PM4 and NMOS transistor NM3 is connected to the gate of the PMOS transistor PM3, and the gates of the same are connected to the node NI, respectively.

As shown in FIG. 3, the bias unit 103 includes a transmission transistor 28 the drain of which is connected to an output terminal of the write driver 101 and the drain of the flash cell 102, respectively, and the gate of which receives an inverted enable signal EN, and a diode-type PMOS transistor 29 connected between the power supply voltage Vdd and the source of the transmission transistor 28.

Figure 6:
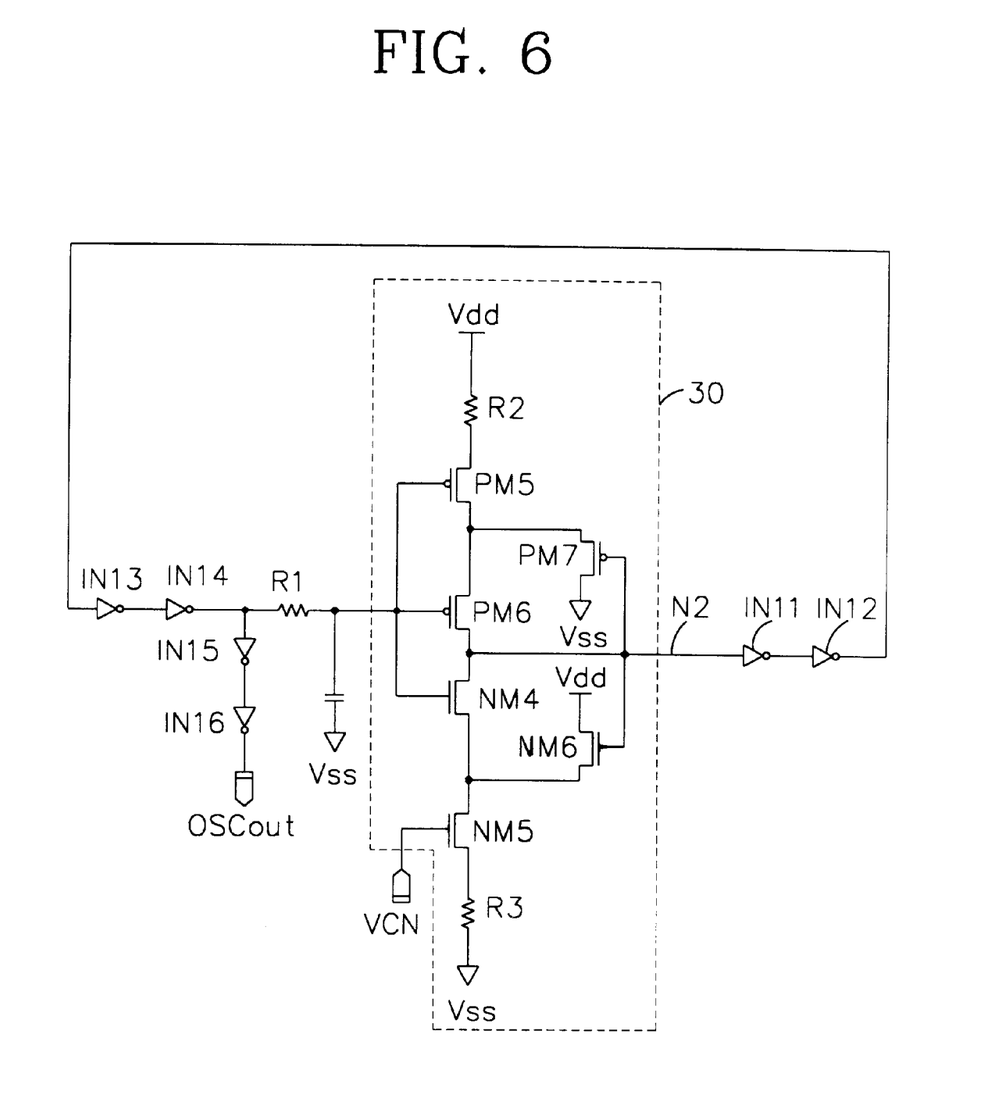
FIG. 6 is a detailed circuit illustrating the oscillator in FIG. 3.

FIG. 6 shows a detailed circuit of the oscillator 104 in FIG. 3. The oscillator 104 is a ring oscillator having a ring-type delay unit 30 and a plurality of delay units IN11 to IN14, and an output terminal OSCout is formed via two delay units IN15, IN16 connected parallely to the output terminal of the delay terminal IN14.

The delay unit 30 includes a resistor R2, PMOS transistors PM5, PM6, NMOS transistors NM4, NM5 and a resistor R3 connected in series between the power supply voltage Vdd and the ground, and a PMOS transistor PM7 and a NMOS transistor NM6 which serves as a Schmitt trigger. The PMOS transistor PM6 and the NMOS transistor NM4 operate as a complementary inverter, and the gate of the PMOS transistor PM5 is connected to the gate of the PMOS transistor PM6, and the gate of the NMOS transistor NM5 receives a frequency control voltage VCN. In addition, the source of the PMOS transistor PM7 is connected to the source of the PMOS transistor PM6, and the gate of which is connected to the output terminal N2. The drain of the NMOS transistor NM6 receives a power supply voltage Vdd, and the gate of which is connected to the output terminal N2, and the source of which is connected to the drain of the NMOS transistor NM5.

The operation of the frequency control circuit for an oscillator according to the present invention will now be described with reference to the following drawings.

① Program (write) Operation of the Flash Cell

If a high level enable signal EN is inputted, the program mode of the flash cell 102 is set.

The switching unit 100 and the write driver 101 are enabled by a high level enable signal EN, and the bias unit 103 blocks the current flow to the flash cell 102 as the transmission transistor 28 is turned off by the low level enable signal EN inverted by the inverter IN1.

The level shifter 20 of the switching unit 100 outputs a ground voltage Vss by the enable signal EN inputted via the inverters IN2,IN3, and the pumping unit 22 is disabled by the high level enable signal EN. Thus, the PMOS transistor 21 outputs the boosted voltage Vpp to the flash cell 102 in accordance with the ground voltage Vss from the level shifter 20. If the low level enable signal EN inverted by the inverter IN4 is inputted into the node N1 via the turned-on NMOS transistor 25, the PMOS transistor PM3 is turned off and the node N1 maintains a low level. Thus, the PMOS transistor 27 is turned on, so that the program voltage $V_{WL}$ is inputted into the flash cell 102.

Therefore, since the threshold voltage Vt of the flash cell 102 is controlled by the boosted voltage Vpp from the switching unit 100, the flash cell 102 programs the program voltage $V_{WL}$ outputted from the write driver 101. At this time, the threshold voltage of the flash cell 102 is varied in accordance with the level of the boosted voltage Vpp, i.e., if the boosted voltage Vpp is increased from 9V to 10V, the threshold voltage Vt is increased from 2V to 3V.

② Read Operation of the Flash Cell

If a low level enable signal EN inverted by the inverter IN1 is inputted, the transmission transistor 28 of the bias unit 103 is turned on, thereby a current flow path is formed toward the flash cell 102. The switching unit 100 outputs a power supply voltage Vdd as a read voltage of the flash cell 102 based on the low level enable signal EN, and the write driver 101 is disabled.

That is, as shown in FIG. 4, the level shifter 20 of the switching unit 100 outputs a boosted voltage Vpp based on the low level enable signal EN inverted by the inverter IN2, so that the PMOS transistor 21 turned off by the boosted voltage Vpp. The pumping unit 22 is enabled by the low level enable signal EN and outputs a pumping voltage Vpp1. Thus, the NMOS transistor 23 is turned on by the pumping voltage Vpp1,and the power voltage Vdd is inputted into the flash cell 102 without a voltage drop. Here, the NMOS transistor 24 pulls-up the output terminal to the level of Vdd-Vt.

As shown in FIG. 5, the latch unit 26 of the write driver 101 outputs a program voltage $V_{WL}$ according to the low level enable signal EN inverted by the inverter IN4, the PMOS transistor 27 is turned off by the program voltage $V_{WL}$. outputted from the latch unit 26. Thus, the write driver 101 is disabled. At this time, the transmission transistor 25 blocks the program voltage $V_{WL}$ of the node N1 from flowing toward the inverter IN4.

Therefore, the flash cell 102 is turned on by the power supply voltage vdd from the switching unit 100. Here, the turn-on degree of the flash cell 102 is determined by the level of the threshold voltage Vt, the amount of the current flowing toward the flash cell 102 from the bias unit 103 is determined by the turn-on degree of the flash cell 102.

Namely, if the threshold voltage Vt of the flash cell 102 is large, the amount of the current that flows into the flash cell 102 is decreased, thereby the frequency control voltage VCN from the bias unit 103 is increased. Alternatively, if the threshold voltage Vt of the flash cell 102 is small, the amount of the current flowing via the flash cell 102 is increased and the frequency control voltage VCN from the bias unit 103 is decreased. Therefore, if the frequency control voltage VCN is increased, the oscillation frequency $f_{osc}$ from the oscillator 104 is increased, if the frequency control voltage VCN is decreased, the oscillation frequency $f_{osc}$ is decreased.

For example, assuming that the delay time of the delay unit 20 is Td1 and each of the delay time of the delay units IN11 to IN16 are Td2, the oscillation frequency $f_{osc}$ of the output voltage OSCout may be expressed by the following equation(3).

$$f_{osc}=1/(Td1+Td2\times 6) \quad (3)$$

Here, 6 represents the stage number of the delay units IN11 to IN16. The delay time Td1 of the delay unit 20 depends on the turn-on resistance rN5 of the NMOS transistor NM5, and each of the delay time Td2 of the delay units IN11 to IN16 are identical.

Therefore, if the frequency control voltage VCN is increased according to the increase of the threshold voltage Vt of the flash cell 102, the turn-on resistance rN5 of the NMOS transistor NM5 and the delay time Td1 is decreased. Thus, When the delay time Td1 is decreased, the oscillation frequency $f_{osc}$ is increased.

Figure 7:
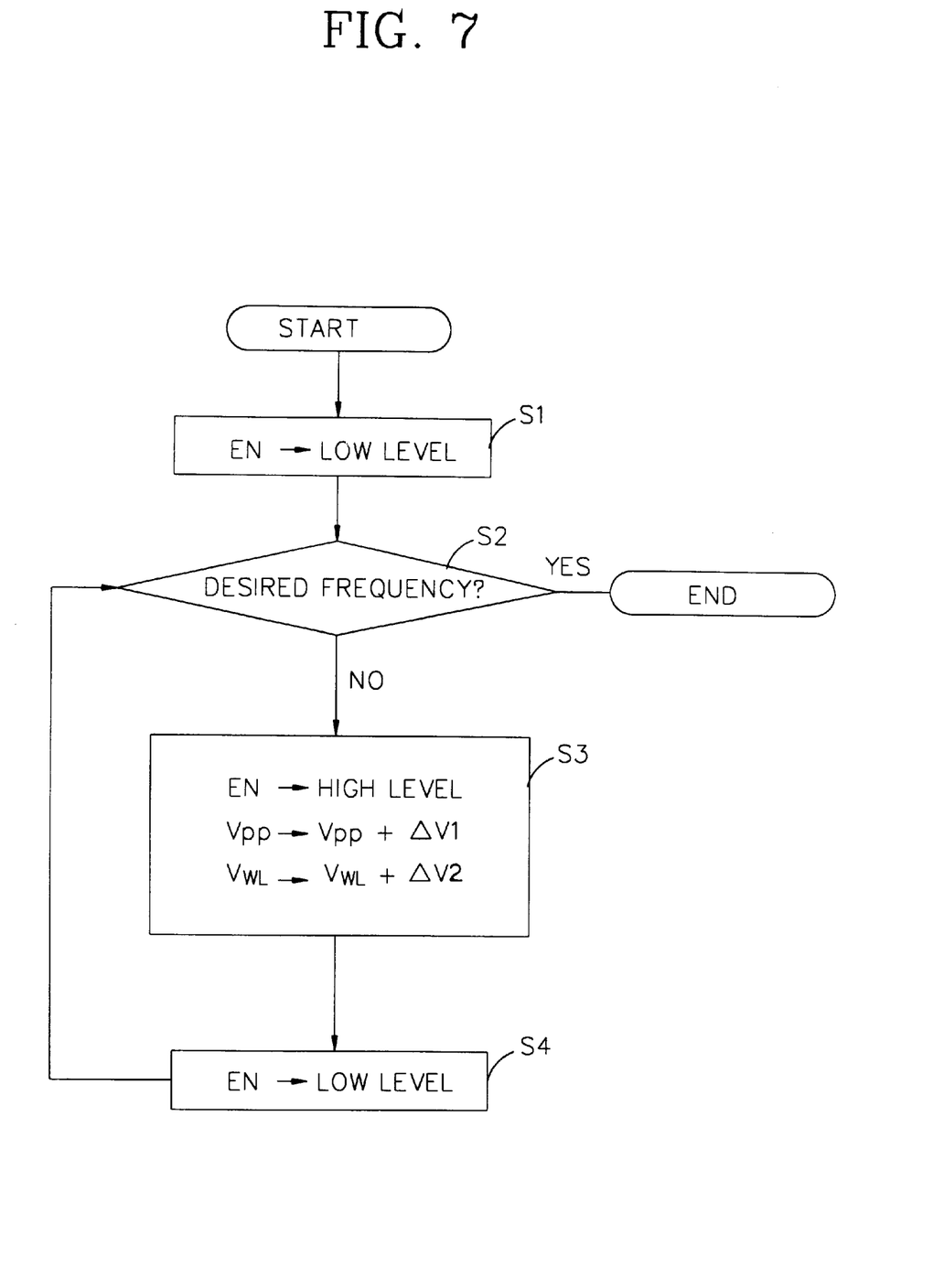
FIG. 7 is a flow chart showing the steps of reading the flash cell 102.

③ Control Operation of the Oscillation Frequency As shown in FIG. 7, in step S1, the read operation of the flash cell 102 is performed by setting(low level) the enable signal EN which determines the program execution.

In step S2, the oscillation frequency $f_{osc}$ from the oscillator 104 is measured in accordance with the frequency control voltage VCN which is determined by the threshold voltage Vt of the flash cell 102 and check whether the measured frequency is a desired frequency. If the measured frequency is judged to be a desired oscillation frequency $f_{osc}$ the frequency control operation is finished, and If the frequency is not a desired frequency, the following frequency control operation is performed.

For example, in step 3, if the measured frequency is slower than the desired frequency, the enable signal EN is set to a high level and then the boosted voltage Vpp and the program voltage $V_{WL}$ are increased for performing the program operation.

Namely, in order to increase the threshold voltage Vt of the flash cell 102, the boosted voltage Vpp is increased more than the initial value by $\Delta V1$ ($\Delta V1 \leq 1V$) and the program voltage $V_{WL}$ is increased by $\Delta V2$ ($\Delta V2 \leq 1V$).

Therefore, te threshold voltage Vt of the flash cell 102 is increased in accordance with the boosted voltage Vpp. For example, the boosted voltage Vpp is sequently increased from 9V to 10V, 11V and 12V, the threshold voltage Vt is increased from 2V to 3V, 4V and 5V.

In step 4, if the program operation of the flash cell 102 is completed, the enable signal EN is set to a low level, and the read operation of the flash cell 102 is performed, and then the oscillation frequency $f_{osc}$ outputted in acordance with the frequency control voltage VCN increased by the increas of the threshold voltage Vt is measured.

In addition, the measured frequency is checked whether it is a desired frequency in Step S2. As a result of the checking, if the measured frequency is a desired frequency, the frequency control operation is completed, and if the frequency is not a desired frequency, the above-described operation is repeatedly performed. At this time, as the processes are increased, the boosted voltage Vpp and the program voltage $V_{WL}$ are increased by $\Delta V$ compared to the initial value.

Alternatively, as a result of the measuring of the frequency at an initial stage, if the measured frequency is faster than the desired frequency, the boosted voltage Vpp and the program voltage $V_{WL}$ are decreased by $\Delta V$ compared to the initial value for thereby controlling the frequency.

Therefore, in the present invention, the frequency control voltage VCN of the oscillator 104 is varied by controlling the program level of the flash cell 102 based on the frequency of the oscillator 104.

As described above, in the present invention, the frequency control voltage of the oscillator is varied in accordance with the program level of the flash cell, so that it is possible to vary the frequency without changing the circuit for thereby accurately setting the frequency.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A frequency control circuit for an oscillator, comprising:
   a flash cell having a cell transistor;
   a switching unit for outputting a first voltage to the flash cell in a program mode according to an enable signal and outputting a second voltage in a read mode;
   a write driver for outputting a program voltage to the flash cell in the program mode according to the enable signal;
   a bias unit for supplying a current to the flash cell in the read mode according to the enable signal and generating a frequency control voltage which is proportional to a threshold voltage of the flash cell; and
   an oscillator for varying an oscillation frequency based on the frequency control voltage.

2. The circuit of claim 1, wherein when the enable signal is a high level, the program mode of the flash cell is performed, and when the enable signal is a low level, the read mode of the flash cell is performed.

3. The circuit of claim 1, wherein the first voltage is a boosted voltage and the second voltage is a power voltage.

4. The circuit of claim 1, wherein a boosted voltage and program voltage are varied from an initial voltage by $\Delta V1$ ($\Delta V1 \leq 1V$).

5. The circuit of claim 4, wherein an absolute value of the boosted voltage and program voltage are greater than that of the power supply voltage.

6. The circuit of claim 1, wherein the switching unit includes:
   a level shifter for outputting a ground voltage in the program mode and outputting a boosted voltage in the read mode;
   a pumping unit for outputting a pumping voltage in the read mode;
   a first NMOS transistor for outputting a read voltage to the cell transistor according to the pumping voltage;
   a second NMOS transistor for pulling-up the output terminal to the level of Vdd-Vt; and
   a first PMOS transistor for outputting a boosted voltage to the cell transistor according to the ground voltage outputted from the level shifter in the program mode.

7. The circuit of claim 6, wherein the level shifter includes:
   second and third PMOS transistors with its sources receive the boosted voltage, and its gates and drains are crossingly connected with the drains and gates of the second and third PMOS transistors, respectively; and
   third and fourth NMOS transistors connected between the drains of the second and third PMOS transistors and the ground, and for receiving an inverted enable signal and the enable signal through its gates.

8. The circuit of claim 1, wherein the write driver includes:
   a first transmission transistor for transmitting the enable signal inverted by the inverter;
   a latch unit for latching an output of the first transmission transistor; and
   the fourth PMOS transistor for outputting a program voltage in accordance with an output signal of the latch unit.

9. The circuit of claim 8, wherein the latch unit latches the output of the first transmission transistor to a ground voltage when the enable signal is a high level, and the latch unit latches the output of the first transmission transistor to the program voltage when the enable signal is a low level.

10. The circuit of claim 8, wherein the first transmission transistor blocks the program voltage outputted from the latch unit from flowing toward the inverter in the read mode.

11. The circuit of claim 8, wherein said latch unit includes:
    a fifth PMOS transistor connected between the program voltage terminal and the gate of the fourth PMOS transistor; and
    a sixth PMOS transistor and a fifth NMOS transistor connected in series between the program voltage and the ground voltage, with its gates connected to the gate of the fourth PMOS transistor, wherein the gate of the fifth PMOS transistor is connected to the output terminal.

12. The circuit of claim 1, wherein the bias unit includes:
    a second transmission transistor with its drain connected the output terminal of the write driver and the cell transistor, and for receiving the inverted enable signal through its gate; and
    a seventh PMOS transistor connected between the power supply voltage and the source of the second transmission transistor, wherein the seventh PMOS transistor is a diode type.

13. The circuit of claim 12, wherein said second transmission transistor blocks the current from flowing toward the flash cell in the program mode.

14. In an oscillator circuit of a flash memory having an oscillator frequency control circuit which varies the frequency of an oscillator based on a frequency control voltage, wherein the frequency control circuit comprises:
    a flash cell having a cell transistor;
    a switching unit for outputting a first voltage for varying a threshold voltage of the cell transistor in a program mode and outputting a second voltage in a read mode;
    a write driver for outputting a program voltage to the drain of the cell transistor in the program mode; and
    a bias unit for supplying a current to the flash cell in the read mode and generating a frequency control voltage which is proportional to a threshold voltage of the flash cell.

15. The circuit of claim 14, wherein the first voltage is a boosted voltage, and the second voltage is a power voltage.

16. The circuit of claim 15, wherein the boosted voltage and program voltage are varied from an initial voltage by $\Delta V1$ ($\Delta V1 \leq 1V$).

17. The circuit of claim 14, wherein the absolute values of the boosted voltage and program voltage are greater than that of the power voltage.

18. The circuit of claim 14, wherein the bias unit includes:
    a transmission transistor, wherein the drain of which is connected to the output terminal of the write driver and the cell transistor, respectively, and the gate of which receives an inverted enable signal; and
    a diode-type PMOS transistor connected between the power supply voltage and the source of the transmission transistor.

19. A frequency control circuit for an oscillator, comprising:
    a flash cell having a cell transistor;
    a switching unit for outputting a first voltage to the flash cell in a program mode;

a write driver for outputting a second voltage to the flash cell in the program mode;

a bias unit for supplying a current to the flash cell in a read mode of the flash cell and generating a frequency control voltage proportional to the threshold voltage of a flash cell; and an oscillator for varying the frequency based on the generated frequency control voltage.

20. The circuit of claim 19, wherein the first voltage is a boosted voltage, and the second voltage is a program voltage.

21. The circuit of claim 20, wherein the first and second voltage are varied from an initial voltage by $\Delta V1$ ($\Delta V1 \leq 1V$).

22. The circuit of claim 20, wherein the threshold voltage of the cell transistor is proportionally varied based on the first voltage.

23. A frequency control method for an oscillator circuit, said the oscillator circuit varies a frequency control voltage based on a threshold voltage of a flash cell and varies the frequency of an oscillator based on the varied frequency control voltage, said method comprising the steps of:

measuring a oscillation frequency of an oscillator by performing a read operation of the flash cell;

comparing the measured frequency with a reference frequency;

varying the threshold voltage of the cell transistor by outputting first and second voltages to the gate and drain of the cell transistor when two frequencies are not identical;

measuring the oscillation frequency of the oscillator according to a frequency control voltage set based on the varied threshold voltage by performing a read operation of the flash cell; and repeating the above-described steps until the measured frequency and reference frequency become identical.

24. The method of 23, wherein the first voltage is a boosted voltage, and the second voltage is a program voltage.

25. The method of claim 24, wherein the boosted voltage and program voltage are varied from an initial voltage by $\Delta V1$ ($\Delta V1 \leq 1V$).

26. The method of claim 25, wherein absolute values of the boosted voltage and program voltage are greater than that of the power voltage.

* * * * *